United States Patent [19]

Simmons

[11] 4,183,088

[45] Jan. 8, 1980

[54] RANDOM NUMBER GENERATOR

[75] Inventor: Robert E. Simmons, San Diego, Calif.

[73] Assignee: The United States of America as represented by the Secretary of the Navy, Washington, D.C.

[21] Appl. No.: 170,287

[22] Filed: Jan. 31, 1962

[51] Int. Cl.$^2$ ............................................ H03B 29/00
[52] U.S. Cl. ...................................... 364/717; 331/78
[58] Field of Search ................ 331/78; 178/22; 332/1; 329/106; 364/717

[56] References Cited

U.S. PATENT DOCUMENTS

| | | | |
|---|---|---|---|
| 2,607,896 | 8/1952 | Chambers | 331/78 |
| 2,974,291 | 3/1961 | Colletti | 331/78 |

*Primary Examiner*—Howard A. Birmiel

*Attorney, Agent, or Firm*—Richard S. Sciascia; Paul N. Critchlow

EXEMPLARY CLAIM

1. A generator for producing random binary bits comprising in combination, means for producing a random noise electrical signal, means coupled to the output of said signal producing means for converting said random noise electrical signal into a variable width square wave signal having polarities proportional to the polarities thereof at any given instant, means connected to the output of said converting means for producing a plurality of constant frequency pulses the number of which is proportional to the widths of those portions of the aforesaid variable width square wave signal having the same polarity, and means effectively connected to said pulse producing means for timely sampling said pulses in terms of binary bits.

13 Claims, 2 Drawing Figures

RANDOM NUMBER GENERATOR

The invention described herein may be manufactured and used by or for the Government of the United States of America for governmental purposes without the payment of any royalties thereon or therefor.

The present invention relates generally to random signal generators and is particularly a random number generator for production of a random sequence of binomial bits having a predetermined probability description.

In the past, it has been known to generate pseudorandom numbers on digital computers. While for some purposes the methods and means of so doing have been satisfactory, for many practical purposes, their generation consumes excessive time, the operation is cyclical, and occasionally the desired random properties fails to be effected.

It is, therefore, an object of this invention to provide an improved random number generator.

Another object of this invention is to provide an improved method and means for generating a random sequence of binomial bits having a predetermined probability description.

A further object of this invention is to generate random binary bit numbers at an exceeding high rate—a rate sufficiently high for compatible use with digital computer systems.

A still further object of this invention is to provide an improved method and means for producing a train of random-width pulses.

Still another object of this invention is to provide an improved method and means of producing packets of pulses having a variable number of pulses incorporated therein.

Another object of this invention is to provide an improved method and means of producing a binary sequence of zeros and ones with a predetermined probability description.

Another object of this invention is to provide an improved method and means of encoding in a cryptographic system.

A further object of this invention is to provide an improved method and means for supplying random numbers to a binomial sequential detector.

Still another object of this invention is to provide an improved method and means for generating fourteen bit random numbers with a precise distribution.

A further object of this invention is to provide an improved noise generator that is easily and economically manufactured and maintained.

Other objects and many of the attendant advantages of this invention will be readily appreciated as the same becomes better understood by reference to the following detailed description when considered in conjunction with the accompanying drawings wherein.

Figure 1:
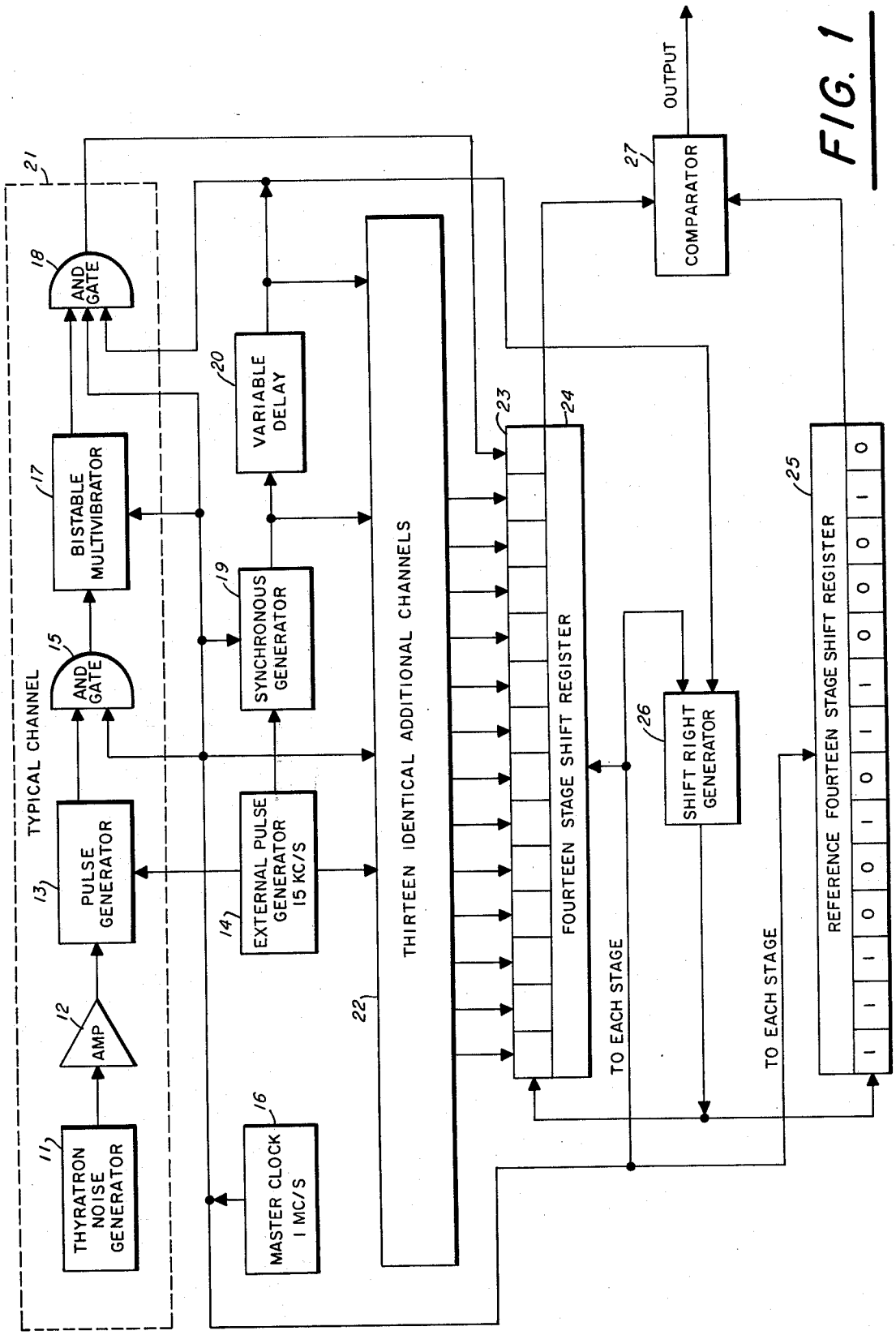
FIG. 1 is a block diagram of the system constituting the subject invention.

Referring now to FIG. 1, there is illustrated an exemplary preferred embodiment of the Random Number Generator constituting this invention as having a thyratron noise signal generator 11 with the output thereof fed through an amplifier 12 to a pulse generator 13 as one of the inputs thereto. The other input thereto is an initiating signal timely supplied by an external pulse generator 14, preferably having an output frequency of the order of fifteen kilocycles per second.

The output of pulse generator 13 is supplied to one of the inputs of an And gate 15, the other input of which is supplied by a master clock 16, preferably operating at an output frequency of the order of one megacycle per second. A bistable flip-flop type of device such as bistable multivibrator 17 receives the output of And gate 15 and, in turn, supplies its output as one of a trio of the inputs of another And gate 18.

External pulse generator 14 also supplies its fifteen kilocycle per second signal to a synchronous generator 19, which is likewise connected to receive the one megacycle per second pulse output from master clock 16 for synchronization purposes. The output of synchronous generator 19 is applied as the input to a variable delay 20, which may be any suitable known delay line or the like. The output thereof is then fed as another of the inputs to And gate 18, along with still another input received from the aforementioned master clock 16.

The aforesaid combined elements referred to as thyratron noise generator 11, amplifier 12, pulse generator 13, And gate 15, bistable multivibrator 17, and And gate 18 are herein considered to be a typical channel 21. Thirteen additional channels depicted as a block 22 are each identical to typical channel 21 and operate in a similar manner. Accordingly, said thirteen identical additional channels are each appropriately connected to receive the fifteen kilocycle output signal from external pulse generator 14, the one megacycle per second output signal from master clock 16, the synchronized output version thereof from synchronous generator 19, and the delayed synchronized version thereof from variable delay 20.

The output of And gate 18 is timely supplied to or "written in" one of the stages 23 of a fourteen stage shift register 24. Likewise, the outputs of the And gates of each of the thirteen identical additional channels of block 22 are appropriately connected to or "written in" the other thirteen stages of shift register 24, respectively.

A reference fourteen stage shift register 25 having any preferred predetermined binary program of ones and zeros stored in the stages thereof is conventionally shifted by a shift right generator 26, which also is connected to the aforesaid shift register 24 for shifting same in a similar manner. Each of the stages of shift registers 24 and 25 as well as shift right generator 26 are operatively synchronized by the one megacycle per second pulse received from master clock 16 as a result of being coupled thereto. The actuating signal for shift right generator 26, however, is received from the output of the previously mentioned variable delay 20.

The outputs of shift registers 24 and 25 are simultaneously applied to a comparator 27, the output of which is a sequence of ones and zeroes having a predetermined probability description, as will be more fully explained in the discussion of the operation of the instant invention following subsequently.

At this time, it should be understood that all of the aforementioned components are conventional and well known in the art per se, and that it is their arrangement, interconnection, and respective interactions that constitutes this invention.

Perhaps an understanding of the actual operation of the subject random number generator will be facilitated by the following presentation and discussion of some of the theory involved. The basic principle is relatively simple. Assuming, for instance, that a gate has a first input consisting of a train of varying width square waves with the width thereof being greater than one microsecond and a second input of one microsecond pulses; then for a period equal to the width of said first input, the output of the gate is a succession of packets of one microsecond pulses with each packet containing a variable number of pulses that is proportional to its respective period and, thus, to the width of its respective square wave. If the width of the input square wave is a random variable with a uniform distribution over a finite range of, say, from twenty to thirty-nine microseconds, then the number of pulses in each packet is uniformely distributed; that is, the expected number of packets with an odd number of pulses is the same as the expected number of packets containing an even number of pulses. Hence:

Probability (odd) = Probability (even) = $\frac{1}{2}$. If the symbol "0" (zero) is assigned to packets containing an even number of pulses and the symbol "1" (one) is assigned to packets containing an odd number of pulses, the output of said gate will consist of a sequence of ones and zeros with an equal probability of occurrence.

In order to ascertain whether a packet of pulses is even or odd, a binary flip-flop (initially set at zero) may be triggered by each pulse therein and the state of the flip-flop sampled in the interval between packets. A one is indicated if the sampled flip-flop is found to be in the "odd" state due to having been triggered by an odd number of pulses, and a zero is indicated if the sampled flip-flop is determined to be in the "even" state due to having been triggered by an even number of pulses. Of course, with this system, said flip-flop must be reset to the zero or even state before the arrival of the next packet. This has some disadvantage because any bias toward an even or odd number of pulses shows up as a bias in the numbers of zeros and ones upon sampling the flip-flop. Although, this procedure may be employed successfully for some operations, in order to smooth out this adverse effect and improve the statistical results, the procedure has been modified in this invention to the extent that the flip-flop is not reset between the arrival of successive packets, thereby allowing it to remain in its prior state, regardless of what it is, until the next packet arrives. Furthermore, it has been found to be advantageous to sample the flip-flop state prior to the arrival of the last pulse of a packet in order to prevent possible deformation thereof by the gating operation and thus cause an adverse bias to result due to flip-flop asymmetry.

To theoretically analyze the improved operation occurring in the present invention as a result of the smoothing effect caused by the aforementioned sampling procedure modifications, let it be assumed that initially the flip-flop is in the zero state and is not reset after being triggered by a packet. Also, let:

p = the probability that a packet has an odd number of pulses.
$p_k$ = the probability that the flip-flop is in the one state after having been triggered by k packets.
$P_0 = 0$ = the probability that a one exists before the start.
$p_1 = p$ = the probability that the flip-flop is in the one state after one packet of pulses.

$$P_k = (1-p)p_{k-1} + p(1-p_{k-1})$$

$$p_k = (1-2p)p_{k-1} + p.$$

The general solution of this difference equation is:

$$p_k = \tfrac{1}{2} + c(1-2p)^k$$

where c is a constant.
Since ti $p_0 = 0$, $$c = -\tfrac{1}{2}$$

therefore, $$p_k = \tfrac{1}{2}[1-(1-2p)^k].$$

Letting:
$\epsilon$ = a very small increment or number.
$|\epsilon|$ = the positive or absolute value of $\epsilon$.
And letting:

$$p = \tfrac{1}{2} + \epsilon, \quad |\epsilon| < \tfrac{1}{2}.$$

then $$p_k = \tfrac{1}{2}[1-(-2\epsilon)^k]$$

and $$\lim_{k \to \infty} p = \tfrac{1}{2}.$$

It can thus be seen that if p differs from $\tfrac{1}{2}$, by taking k large enough, $p_k$ will be as close to $\tfrac{1}{2}$ is desired, and this is the motivation for not resetting the flip-flop after each packet.

Closer examination of the above analysis reveals, however, that not resetting the flip-flop is not a complete panacea, especially if $|\epsilon|$ is not very small. If it is assumed that k is large enough so that $p_k = \tfrac{1}{2}$, then $$\text{Prob}\,[(1,1)] = \text{Prob}\,[(0,0)] = \tfrac{1}{2}(\tfrac{1}{2}-\epsilon)$$

and $$\text{Prob}\,[(1,0)] = \text{Prob}\,[(0,1)] = \tfrac{1}{2}(\tfrac{1}{2}+\epsilon).$$

Thus, if $|\epsilon|$ is not very small, the probabilities associated with pairs are biased in the not resetting situation.

But in the reset flip-flop situation, after the arrival of each packet, then the pair of probabilities are:

$$\text{Prob}\,[(1,1)] = (\tfrac{1}{2}+\epsilon)^2 = \tfrac{1}{4}+\epsilon+\epsilon^2$$

$$\text{Prob}\,[(1,0)] = (\tfrac{1}{2}+\epsilon)(\tfrac{1}{2}-\epsilon) = \tfrac{1}{4}-\epsilon^2$$

$$\text{Prob}\,[(0,1)] = (\tfrac{1}{2}-\epsilon)(\tfrac{1}{2}+\epsilon) = \tfrac{1}{4}-\epsilon^2$$

$$\text{Prob}\,[(0,0)] = (\tfrac{1}{2}-\epsilon)^2 = \tfrac{1}{4}-\epsilon+\epsilon^2.$$

Comparison of these probabilities with those of the not reset flip-flop situation shows that two of the pair probabilities are improved by resetting while two have been biased more, depending on the magnitude of $\epsilon$. Of course, when $\epsilon$ is small enough not to be a critical factor, the not reset flip-flop procedure is much to be preferred because of the additional smoothing obtained which, in turn, leads to obtaining better first order statistical properties.

Further processing of such flip-flop states may be quantized to obtain a random sequence of ones and zeros with a predetermined probability of a one by sampling the state of a plurality of flip-flops existing in a like plurality of channels, which are identical to the channel containing the flip-flop and sampling thereof theoretically discussed above, and momentarily storing or writing in the plurality of samples received therefrom in a shift register having a comparable number of stages. In other words, the state of each flip-flop of each channel is respectively written into a stage of a shift register. Then, if the contents of this shift register are shifted through a comparator together with the contents of a reference shift register which contains an appropriate preset program of binary bits (ones and zeros) respectively stored in the stages thereof, the output of the comparator is a sequence of ones and zeros having a predetermined probability of a one.

Assuming the two aforementioned shift registers are fourteen stage shift registers which are combined with said comparator to form a quantizer, the foregoing results therefrom may be effected if the output of the first mentioned shift register is greater than the output of the reference shift register. For example, assuming that 14 bits of the first mentioned shift register are independent, $2^{14}$ binary numbers are equally possible. Hence the fixed number of bits stored in the reference shift register can be chosen in such manner that prob $[c=1]$ takes on any fixed value which is a multiple of $2^{14}$ and is between zero and one. Again, if this is done, the output of the comparator will be a sequence of ones and zeros with a predetermined probability of a one, and the desired quantizing will have been effected.

Figure 2:
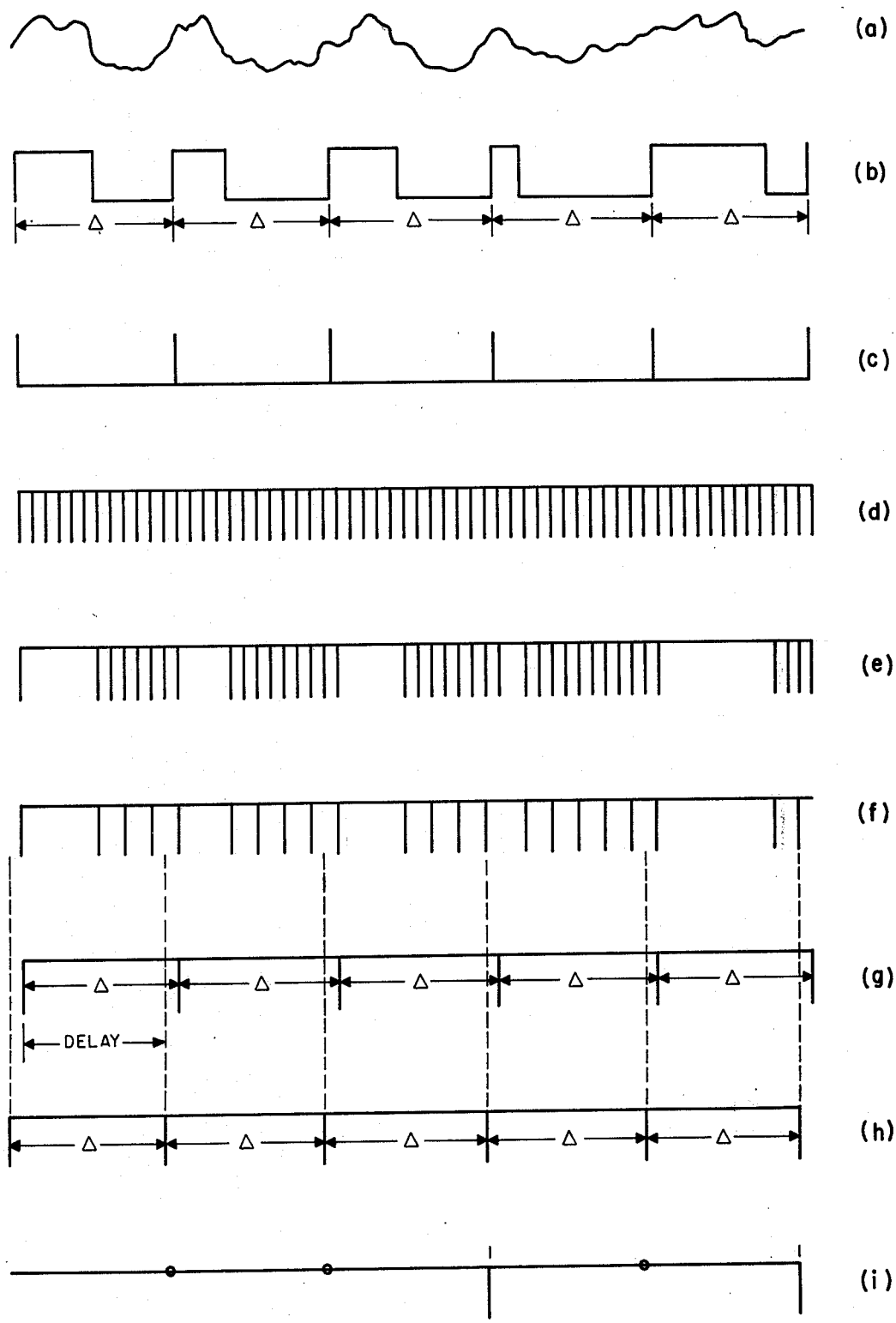
FIG. 2 depicts a plurality of correlated exemplary waveforms representing the output signals from various and sundry components incorporated in the system of FIG. 1.

In actual operation of the subject invention, the foregoing theoretical principles are applied. Said actual operation will now be explained in conjunction with the structure of FIG. 1 and the waveforms of FIG. 2.

Thyratron noise generator 11 produces a truly random noise-like electrical output signal which when amplified may appear as shown in the exemplary waveform of FIG. 2(a). This signal, in turn, is used to modulate the pulse or wave width of pulse generator 13. The output of pulse generator 13 is typically shown in FIG. 2(b) as a pulse-width modulated square wave with the leading edges of the positive portions thereof occurring at fixed intervals Δ. The pulse width varies randomly between fixed limits, the maximum width depending on the maximum modulation applied, and the fixed intervals Δ are initiated and regulated by a control signal, exemplary illustrated in FIG. 2(c), applied to pulse generator 13 by external pulse generator 14.

And gate 15 has a pair of inputs, one of which is the output of pulse generator 13, and the other of which is the one megacycle per second signal, represented by the waveform of FIG. 2(b), supplied by master clock 16. Due to the coincidence action of And gate 15, the output thereof is a packet of one megacycle pulses like those represented by the waveform of FIG. 2(e). From said figure, it can be seen that coincidence occurs in And gate 15 when both of the inputs thereto are negative, and, accordingly, the output therefrom is likewise negative in character with the widths of the packets being substantially equal to the random widths of the negative portions of the waveform of FIG. 2(b), respectively. Consequently, it can readily be seen that the widths of these packets are random too, and furthermore, since the leading edges of the noise-modulated pulses occur at fixed intervals and the pulse width varies randomly, the interpulse durations likewise vary randomly.

The one megacycle pulses contained in the aforesaid succession of random width packets each trigger a bistable multivibrator type flip-flop 17, which, of course, changes state following the application of each impulse thereto. Depending on the width of any given packet, the flip-flop may be in either the one or zero state at the end thereof. An exemplary waveform which approximately represents the output of multivibrator 17 is depicted in FIG. 2(f).

In order to sample the state of multivibrator 17, the output thereof is And gated and passed when a delayed synchronous generator pulse obtained from the combined synchronous generator 19 and variable delay line 20 and a one megacycle per second sync signal provided by master clock 16 occurs simultaneously. FIG. 2(g) shows a waveform representing a typical synchronous generator pulse, and, in addition, it can be seen that it, too, is initiated at fixed time period intervals Δ. FIG. 2(h) represents the type of delayed signal which may be supplied by variable delay 20. Although the particular amount of delay employed is a matter of design choice which would be obvious to the skilled artisan when the design of the specific conventional elements constituting the subject system are taken into consideration, delay should be accomplished in such a way that the writing of or passing of the signal representing the condition of multivibrator 17 into stage 23 of shift register 24 occurs at some time near the end of each packet of one megacycle pulses. Because the delayed synchronous generator pulse is actually applied for And gating purposes before multivibrator 17 stops, the output of And gate 18 may be a one or a zero, as graphically represented by FIG. 2(i), depending on the state of multivibrator 17 at the time of arrival of said delayed pulse at And gate 18. In other words, if there if a negative polarity coincidence between the output signal of multivibrator 17 and the delayed signal from variable delay 20, And gate 18 will pass a one. But if said coincidence is nonexistent, a zero will occur at the output of And gate 18. Although, as mentioned above, the presently disclosed preferred embodiment employs a pair of negative pulses in the sampling process to symbolically define a binary bit representing a one, it should, however, be understood that a pair of positive pulses with an appropriate And gate responsive thereto may likewise be employed to represent a binary one if so desired, and so doing should be considered as falling within the scope of this invention. In either event, said output will be a random binary number and successful sampling will have been accomplished.

The output of And gate 18 is the output of one unit of the instant random number generator. Similar outputs are considered to be obtained from the thirteen identical additional channels represented by block 22.

To effect a random sequence of ones and zeros with a predetermined probability of a one, further processing of the aforementioned random binary numbers is required. Accordingly, the outout from each of said fourteen channels is timely used respectively stored in one stage of fourteen stage shift register 24. Functionally associated therewith is shift register 25 which has a predetermined program of fourteen binary bits stored in the stages thereof. An exemplary program is shown to be one, one, one, zero, zero, one, zero, one, one, zero, zero, zero, one, and zero in the preferred embodiment of shift register 25 illustrated in FIG. 1. However, it should be understood that any other program may be used which will produce the desired results. Moreover, although fourteen channels and fourteen stage shift registers are employed in the preferred embodiment of FIG. 1, it should be obvious that any appropriate desired number of stages may be employed without violating the spirit and scope of this invention, inasmuch as so doing would ostensively be obvious to one skilled in the art from the teachings herein presented.

Both of said shift registers are timely shifted serially to the right by the output of shift right generator 26 which, of course, is itself actuated by the delayed synchronous generator signal from variable delay 20. In order to provide the proper synchronization of operations of all channels and the shift registers and their shift right generator, each is appropriately coupled to master clock 16 so that each respective operation will occur at its own proper time but simultaneously with one of the pulses of the one megacycle per second master clock signal. The contents of both shift registers are fed to comparator 27 as they are right shifted by shift generator 26, where they are compared to ascertain which shift register contains the greatest binary number. In event the content of shift register 24 is greater than that of shift register 25, the output of comparator 27 is a one, and vice versa, and for reasons presented previously in the theoretical discussion, said output is actually a binomial sequence of ones and zeros with a predetermined probability of a one occurring at any given instant.

As a consequence of this result, it has been found to be appropriate and convenient to use this binomial sequence as the input to a binomial sequential detector. Moreover, if so desired, the subject random number generator could be compatibly combined with most binary computers either by buffering into an operational register or by the use of magnetic or paper tape, since a fifteen to twenty kilocycle per second generating rate can be easily attained, since the generated numbers are not cyclic, and inasmuch as statistical tests have given no reason for rejecting the generated numbers on the ground of their not possessing random character.

Therefore, although not shown in the drawing, the output of comparator 17, which, of course, constitutes the output of the instant random number generator, may be applied to any suitable indicator, recorder, or other appropriate readout device, or any other pertinent instrumentation or equipment compatibly associated therewith.

Obviously, many modifications and variations of the present invention are possible in the light of the above teachings. It is, hence, to be understood that within the scope of the appended claims, the subject invention may be practiced otherwise than as specifically described.

What is claimed and desired to be protected by Letters Patent of the United States is:

1. A generator for producing random binary bits comprising in combination, means for producing a random noise electrical signal, means coupled to the output of said signal producing means for converting said random noise electrical signal into a variable width square wave signal having polarities proportional to the polarities thereof at any given instant, means connected to the output of said converting means for producing a plurality of constant frequency pulses the number of which is proportional to the widths of those portions of the aforesaid variable width square wave signal having the same polarity, and means effectively connected to said pulse producing means for timely sampling said pulses in terms of binary bits.

2. Means for producing random binomial numbers comprising in combination, means for producing a random frequency-random amplitude signal, a pulse generator having a pair of inputs one of which is coupled to the output of said random frequency-random amplitude signal producing means, an external pulse generator having an output connected to the other input of said pulse generator for timely initiating the pulses therefrom, a first And gate having a pair of inputs one of which is coupled to the output of said pulse generator for timely response to the pulse therefrom, a master clock having an output connected to the other input of said first And gate, a bistable multivibrator having a pair of inputs one of which is coupled to the output of said first And gate and the other of which is connected to the output of said master clock, a synchronous generator having a pair of inputs respectively connected to the outputs of said external pulse generator and the aforesaid master clock, a variable delay line coupled to the output of said synchronous generator, a second And gate having a trio of inputs one of which is connected to the output of said bistable multivibrator, another of which is connected to the output of said master clock, and the other of which is connected to the output of the aforesaid variable delay line.

3. Means for producing random binomial numbers comprising in combination, a pulse generator, means coupled to the input of said pulse generator for modulating the pulses thereof in such manner that their leading edges occur at fixed intervals while their pulse widths are randomly varied between fixed limits, means connected to the output of said pulse modulating means for producing successive packets of pulses which have a constant frequency that is higher than the highest frequency of the pulses generated by the aforesaid pulse generator, each of said successive packets of pulses having a width substantially equal to the widths of those portions of said modulated pulses having a similar predetermined polarity, and means coupled to the output of said packet producing means for sampling each packet therefrom a predetermined time before the end pulse thereof is terminated in terms of a one or a zero is a pulse is or is not present respectively at the sampling instant.

4. The device of claim 3 wherein said means coupled to the input of said pulse generator for modulating the pulses thereof in such manner that their leading edges occur at fixed intervals while their pulse widths are randomly varied between fixed limits comprise an external pulse generator.

5. The device of claim 3 wherein said means connected to the output of said pulse modulating means for producing successive packets of pulses which have a constant frequency that is higher than the highest frequency of the pulses generated by the aforesaid pulse generator comprises a master clock and an And gate having a pair of inputs one of which is connected to the output of said master clock and the other of which is coupled to the output of said pulse generator.

6. The device of claim 5 further characterized by a bistable multivibrator having a pair of inputs one of which is coupled to the output of said master clock and the other of which is connected to the output of the aforesaid And gate.

7. A random number generating means for producing a random sequence of binary ones and zeros with a predetermined probability of a one comprising in combination, means for producing a plurality of signals each